United States Patent
Yan et al.

(10) Patent No.: US 9,601,898 B2
(45) Date of Patent: Mar. 21, 2017

(54) OPTICAL MODULE

(71) Applicants: Hisense Broadband Multimedia Technologies, Ltd., Tortola (VG); Hisense USA Corp., Suwanee, GA (US); Hisense International Co., Ltd., Qingdao, Shandong (CN)

(72) Inventors: Hongping Yan, Shandong (CN); Dengshan Xue, Shandong (CN); Qisheng Zhao, Shandong (CN); Ming Li, Shandong (CN)

(73) Assignees: Hisense Broadband Multimedia Technologies, Ltd., Tortola (VG); Hisense USA Corp., Suwanee, GA (US); Hisense International Co., Ltd., Qingdao, Shandong (CN)

( * ) Notice: Subject to any disclaimer, the term of this patent is extended or adjusted under 35 U.S.C. 154(b) by 0 days.

(21) Appl. No.: 15/078,720

(22) Filed: Mar. 23, 2016

(65) Prior Publication Data

US 2017/0005452 A1 Jan. 5, 2017

(30) Foreign Application Priority Data

Jun. 30, 2015 (CN) .......................... 2015 1 0375073

(51) Int. Cl.

| | |
|---|---|
| *H01S 3/13* | (2006.01) |
| *H01S 3/107* | (2006.01) |
| *H01S 5/068* | (2006.01) |
| *H01S 5/0683* | (2006.01) |
| *H01S 5/125* | (2006.01) |
| *H01S 5/0687* | (2006.01) |
| *H01S 5/187* | (2006.01) |

(52) U.S. Cl.
CPC .............. *H01S 3/107* (2013.01); *H01S 5/068* (2013.01); *H01S 5/0687* (2013.01); *H01S 5/06832* (2013.01); *H01S 5/06835* (2013.01); *H01S 5/125* (2013.01); *H01S 5/187* (2013.01)

(58) Field of Classification Search
CPC .. H01S 5/068; H01S 5/06835; H01S 5/06832; H01S 5/0687; H01S 5/125; H01S 5/187
USPC .................................... 372/29.02, 30, 31, 32
See application file for complete search history.

(56) References Cited

U.S. PATENT DOCUMENTS

| | | | | |
|---|---|---|---|---|
| 5,936,754 | A | * | 8/1999 | Ariyavisitakul . H04B 10/25758 398/103 |
| 5,977,604 | A | * | 11/1999 | Babic ................ H01L 29/66234 257/466 |
| 6,411,640 | B1 | * | 6/2002 | Nakanishi ........... H01S 5/18313 257/98 |

(Continued)

*Primary Examiner* — Kinam Park
(74) *Attorney, Agent, or Firm* — Brinks Gilson & Lione

(57) ABSTRACT

The disclosure provides an optical module. In the optical module, emitters of a first PNP type triode and a second PNP type triode connected with a power source are high-level always, when a bias pin of a laser transmitter driver chip is high-level, bases of the two PNP type triodes are both high-level and in an OFF state, no current flows to the bias pin and a laser transmitter, and the laser transmitter does not emit light; when the bias pin of the laser transmitter driver chip is low-level, the bases of the two PNP type triodes are both low-level and in an ON state, the current flows to the bias pin and flows from a positive terminal of the laser transmitter, and the laser transmitter emits light.

20 Claims, 6 Drawing Sheets

(56) References Cited

U.S. PATENT DOCUMENTS

2004/0091008 A1* 5/2004 Rubin .................. H01S 5/0687
372/43.01

* cited by examiner

OPTICAL MODULE

PRIORITY STATEMENT

This application claims priority benefit of Chinese Patent Application No. 201510375073.3 filed on Jun. 30, 2015, in the State Intellectual Property Office of the People's Republic of China, the disclosures of which is incorporated herein in its entirety by reference.

TECHNICAL FIELD

The disclosure relates to the technical field of optical communication, and in particular, to an optical module.

BACKGROUND

Along with the increase of a request of people for communication bandwidth, a Fiber-to-the-x (FTTx) technology obtains fast development, and the FTTx technology taking a Passive Optical Network (PON) technology as the principal thing is widely applied.

SUMMARY

According to an aspect of the present disclosure, an optical module may comprise a laser transmitter driver chip including a bias pin; a laser transmitter including a positive terminal and a negative terminal; a Distributed Bragg Reflector (DBR) raster including a negative terminal; a first triode including a first emitter, a first collector, and a first base; a second triode including a second emitter, a second collector and a second base; and a power source. The first emitter and second emitter are both connected to the power source; the first collector, the first base and the second base are connected to the bias pin; the second collector is connected to the positive terminal of the laser transmitter; and the negative terminal of the laser transmitter and the negative terminal of the DBR raster are grounded.

According to another aspect of the present disclosure, an optical module may comprise a laser transmitter driver chip including a bias pin; a laser transmitter including a positive terminal and a negative terminal; a Distributed Bragg Reflector (DBR) raster including a negative terminal; a first triode including a first emitter, a first collector, and a first base; a second triode including a second emitter, a second collector and a second base; and a power source. The first collector and the second collector are both connected to the power source; the first emitter, the first base, and the second base are connected to the bias pin; the second emitter is connected to the positive terminal of the laser transmitter; and the negative terminal of the laser transmitter and the negative terminal of the DBR raster are grounded.

BRIEF DESCRIPTION OF THE DRAWINGS

In order to clearly illustrate embodiments of the disclosure, or technical solutions in the prior art, drawings used in description of the embodiments or the prior art are briefly described. Apparently, the drawings described as follows are some embodiments of the disclosure, and those of ordinary skill in the art can obtain other drawings according to these drawings without paying out inventive labor.

DETAILED DESCRIPTION

In order to clarify the objectives, technical solutions and advantages of the embodiments of the disclosure, the technical solutions of the embodiment will be described in a clearly and fully understandable way in connection with the drawings in the embodiments of the disclosure.

Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
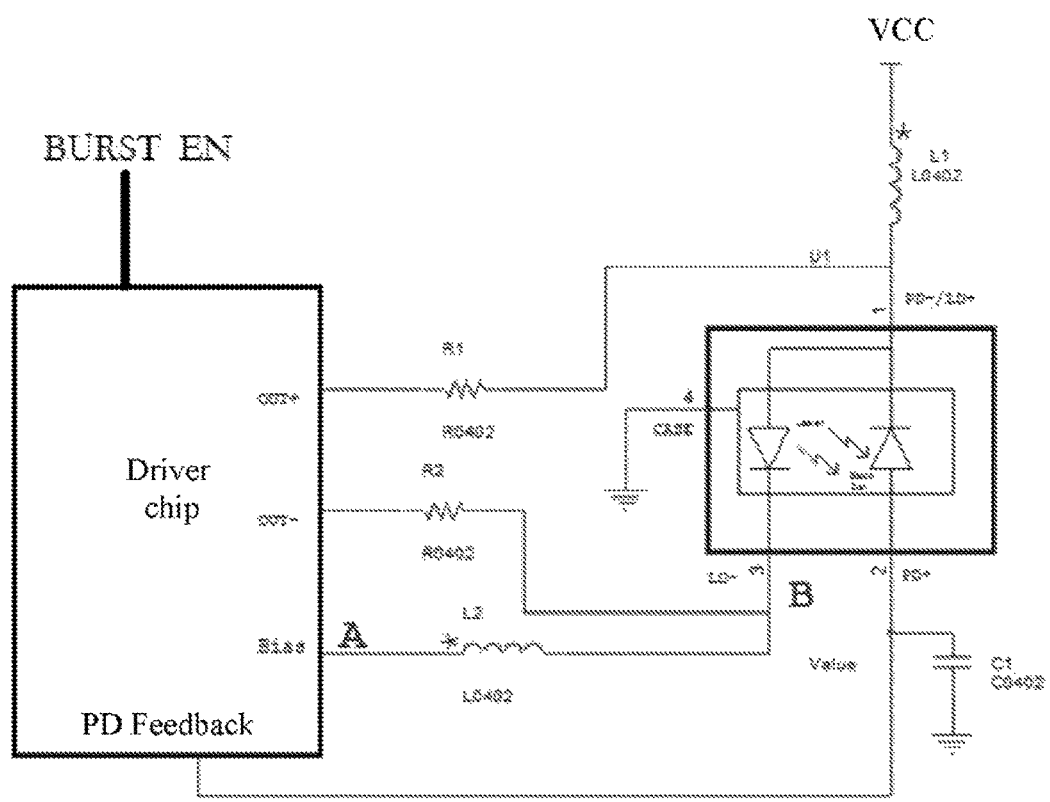
FIG. 1 is a schematic diagram of a prior art bust transmission circuit.

A Passive Optical Network (PON) usually includes an optical line terminal mounted at a central control station and an Optical Network Unit (ONU) mated and mounted in each user occasion, and the ONU is provided with a burst transmission circuit for transmitting an optical signal. FIG. 1 is a schematic diagram of a bust transmission circuit in the prior art. As shown in FIG. 1, in the existing PON ONU, the burst transmission circuit includes a driver chip and a Distributed Feedback Laser (DFB), the Bias current received by the driver chip is in an SINK mode. In SINK mode, the Bias current is input into a point A from a point B in FIG. 1, and the laser is switched on to emit light; and when a Bias pin is high-level, the laser is disconnected and does not emit light.

While in a Wavelength Division Multiplexing (WDM)-based PON, the laser in the burst transmission circuit needs to use a tunable laser with a Distributed Bragg Reflector (DBR), the DBR laser emits light of different wavelengths by controlling the magnitude change of input current; therefore, in order to stabilize the current flowing through the DBR laser, a negative terminal of the DBR laser and a DBR negative terminal are connected together and grounded to provide a stable low level for the DBR laser, the light of different wavelengths can be accurately selected according to requirements, the DBR laser is also in an SINK mode, and current needs to be input from LD+ of the DBR laser. Thus under the SINK mode, a laser transmitter driver chip cannot control the DBR laser under the SINK mode to emit a laser beam.

The bias current of the laser transmitter driver chip involved in the embodiments of the disclosure is in the SINK mode, that is, whether the laser is driven to be switched on or not can only be realized by inputting current to the bias pin of the laser transmitter driver chip; in the WDM-based PON, the DBR laser is used. When the light of different wavelengths is selected, usually, selection is realized by controlling the magnitude change of the current input into a DBR raster in the DBR laser; therefore, in order to stabilize the current flowing through the DBR raster, a negative terminal of the DBR raster needs to be grounded, but due to the restriction of a manufacturing process, currently, when the DBR laser is manufactured, the negative terminal of the laser transmitter in the DBR laser and the negative terminal of the DBR raster are connected together and are grounded, the laser transmitter of the DBR laser is also in the SINK mode, and current needs to be input from a positive terminal of the laser transmitter of the DBR laser. When the laser transmitter driver chip and the laser transmitter are both in the SINK mode, whether the laser transmitter emits light or not cannot be controlled by the laser transmitter driver chip. An optical module provided by the embodiments of the disclosure is described in detail in combination with the drawings through the embodiments.

Figure 2:
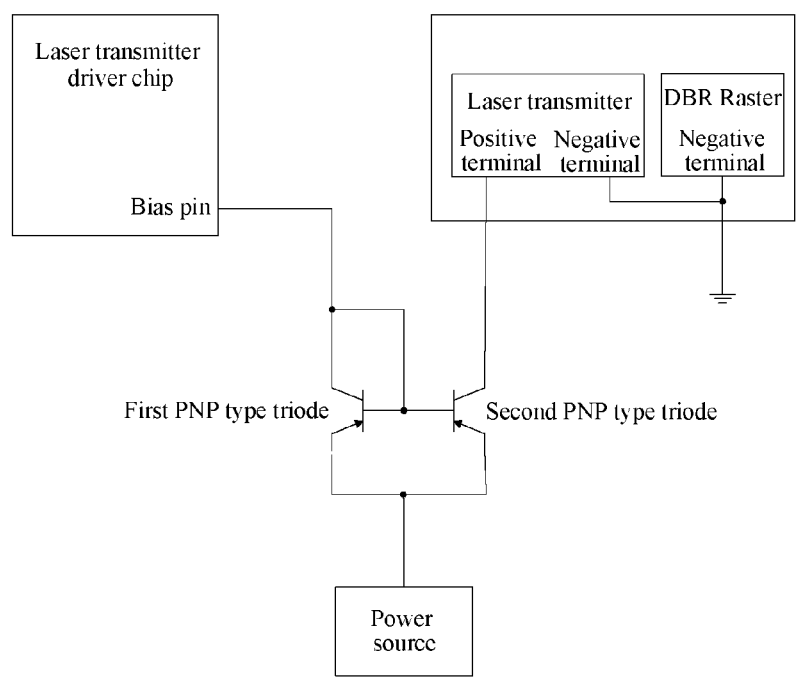
FIG. 2 is a schematic diagram of an optical module according to some embodiments of the disclosure.

FIG. 2 is a schematic diagram of an optical module according to some embodiments of the disclosure. The optical module may include: a laser transmitter driver chip, a laser transmitter, a DBR raster, a first PNP type triode, a second PNP type triode and a power source. The first PNP type triode ("the first triode") include an emitter ("the first emitter"), a collector ("the first collector") and a base ("the first base"). The second PNP type triode ("the second triode") include an emitter ("the second emitter"), a collector ("the second collector") and a base ("the second base"). The laser transmitter includes a positive terminal and a negative terminal. The DBR raster includes a negative terminal.

Both of the first and second emitters are connected with the power source. The first collector and the first and second bases are connected with the bias pin of the laser transmitter diver chip. The second collector is connected with the positive terminal of the laser transmitter. the negative terminal of the laser transmitter and a negative terminal of the DBR raster are grounded.

When a voltage on the bias pin is low-level, the first triode and the second triode are switched on, and the laser transmitter is switched on to emit light; when the voltage on the bias pin is high-level, the first triode and the second triode are switched off, and the laser transmitter is disconnected and does not emit light.

It should be noted that when the DBR laser is designed, the negative terminal of the laser transmitter and the negative terminal of the DBR raster are connected together and grounded, which is caused by two reasons: 1. the negative terminal of the laser transmitter and the negative terminal of the DBR raster are connected together due to a manufacturing process; 2. grounding the negative terminals of the laser transmitter and the DBR raster results that the low level of the DBR raster is stable, which can ensure a stable current flowing through the DBR raster, and therefore, light of different wavelengths can be accurately selected as required by controlling the magnitude change of input current, and such design causes that the laser transmitter can emit light only when the current is input from the positive terminal of the laser transmitter.

For the laser transmitter driver chip under the SINK mode, its bias pin needs current input, and therefore in this embodiment, the first triode and the second triode are arranged between the bias pin of the laser transmitter driver chip and the positive terminal of the laser transmitter, the emitters of the first triode and the second triode are connected with the power source to input the current to the bias pin and the positive terminal of laser transmitter; therefore, the fact that the laser transmitter is controlled to emit light by the laser transmitter driver chip in the SINK mode becomes possible.

In a work process of the optical module, the level of the bias pin in the laser transmitter driver chip is controlled by a control unit in an ONU where the optical module is positioned, and a work principle of the control unit may be obtained with reference to the prior art and is not repeated in this embodiment.

Since the emitters of the first triode and the second triode are connected with the power source and are always high-level, when the bias pin is controlled by the control unit to be high-level, the first collector and the first and second bases are connected with the bias pin, and therefore the first collector and the first and second bases are high-level; in other words, the first collector and the bases and emitters of the first triode and the second triode are all high-level, which does not meet a switch-on condition of the PNP type triodes, the first triode and the second triode are both switched off, a current loop is disconnected, that is, the current provided by the power source cannot flow to the bias pin and the positive terminal of the laser transmitter, and in this case, since no current flows through the laser transmitter, the laser transmitter does not emit light.

When the bias pin is controlled by the control unit to be low-level, the first collector and the first and second bases are connected with the bias pin, and therefore the first collector and the first and second bases are low-level; in other words, the first collector and the first and second bases are low-level, and the emitters of the first triode and the second triode are both high-level, the emitters are higher than the bases in level, which meets a switch-on condition of the PNP type triodes, the first triode and the second triode are both switched on, the current provided by the power source flows to the bias pin through the first triode and flows to the positive terminal of the laser transmitter through the second triode, the current flowing to the positive terminal of the laser transmitter flows out from the negative terminal of the laser transmitter, and the laser transmitter emits light.

In other words, in this embodiment, the level of the bias pin is set to be high-level or low-level, and the first triode and the second triode are switched on or switched off at the same time, thereby controlling the laser transmitter to emit light or not.

In a practical application, when the ONU where the optical module in this embodiment is positioned is designed, a Small Form Factor (SFF) technology is adopted for packaging the optical module, and a Bi-Directional Optical Sub-Assembly (BOSA) realizes an uplink burst transmission rate being 1.25 Gb/s of 14 channels and realizes a downlink continuous receiving rate being 1.25 Gb/s of 16 channels, a code pattern is a Pseudo Random Binary Sequence (PRBS) 7, an uplink channel wavelength is C wave band wide spectrum receiving, a downlink channel wavelength is C− wave band, and a channel interval is 100 GHz.

According to the optical module provided by this embodiment, the first triode and the second triode are connected with the power source, the emitters are high-level always, when the bias pin of the laser transmitter driver chip is set to be high-level, the first and second bases connected with the bias pin and the first collector are high-level, in this case, the first triode and the second triode are both switched off, no current flows from the power source to the bias pin and the positive terminal of the laser transmitter, and the laser transmitter does not emit light. When the bias pin of the laser transmitter driver chip is set to be low-level, the first collector and the connected first and second bases are low-level, the first triode and the second triode are both switched on, current flows from the power source to the bias pin through the first triode and flows to the positive terminal of the laser transmitter through the second triode, and the laser transmitter emits light. In a case that the laser transmitter and the laser transmitter driver chip are both in the SINK mode, whether current flows to the bias pin and the positive terminal of the laser transmitter can be controlled simultaneously by the power source and the two PNP type triodes, thereby controlling the laser transmitter to emit light by the laser transmitter driver chip in the SINK mode.

Figure 3:
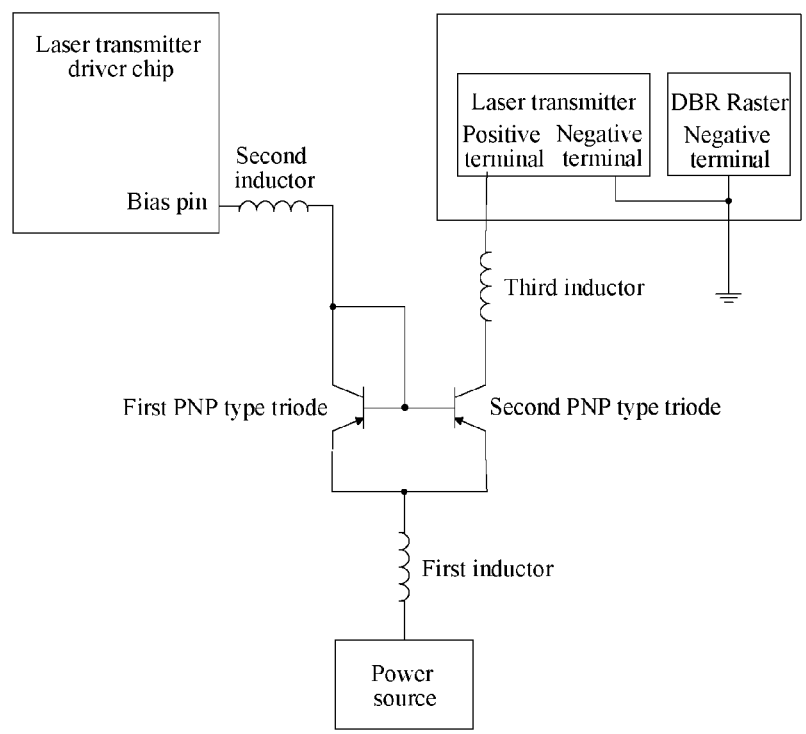
FIG. 3 is a schematic diagram of an optical module according to some embodiments of the disclosure.

FIG. 3 is a schematic diagram of an optical module according to some embodiments of the disclosure. As shown in FIG. 3, based on the previous embodiment, in order to filter a noise signal, in the optical module of this embodiment, the emitters of the first triode and the second triode are connected with the power source through a first inductor; and/or the first collector and the first and second bases are connected with the bias pin of the laser transmitter driver chip through a second inductor; and/or the second collector is connected with the positive terminal of the laser transmitter through a third inductor.

Because an inductor has low resistance to low frequency current change and high resistance to high frequency current change, the inductor can serve as a filter device to filter out high frequency current or voltage disturbance. In this embodiment, the emitters of the first triode and the second triode are connected with the power source by the first inductor; therefore, the voltage of the power source can be substantially stably applied to the first triode and the second triode, and the first triode and the second triode are prevented from being damaged due to overlarge voltage at the moment of being switched on.

The first collector and the first and second bases are connected with the bias pin of the laser transmitter driver chip by the second inductor; therefore, the voltage can be substantially stably applied to the laser transmitter driver chip by the second inductor, and the laser transmitter driver chip is prevented from being damaged due to overlarge voltage at the moment of being switched on.

The second collector is connected with the positive terminal of the laser transmitter by the third inductor; therefore, the voltage can be substantially stably applied to the laser transmitter by the third inductor, and the laser transmitter is prevented from being damaged due to overlarge voltage at the moment of being switched on.

It should be noted that the first inductor, the second inductor and the third inductor can be connected in the circuit at the same time, or at least one of the first inductor, the second inductor and the third inductor is connected, which is not limited in this embodiment.

In this embodiment, since the emitters of the first triode and the second triode are connected with the power source by the first inductor, the emitters are always high-level, when the bias pin is controlled by the control unit to be high-level, the first collector and the first and second bases are connected with the bias pin by the second inductor, and therefore the first collector and the first and second bases are high-level; in other words, the first collector and the bases and emitters of the first triode and the second triode are all high-level, which does not meet a switch-on condition of the PNP type triodes, the first triode and the second triode are both switched off, a current loop is disconnected, that is, the current provided by the power source cannot flow to the bias pin and the positive terminal of the laser transmitter, and in this case, since no current flows through the laser transmitter, the laser transmitter does not emit light.

When the bias pin is controlled by the control unit to be low-level, the first collector and the first and second bases are connected with the bias pin by the second inductor, and therefore the first collector and the first and second bases are low-level; in other words, the first and second bases are both low-level, and the emitters of the first triode and the second triode are both high-level, the emitters are higher than the bases in level, which meets a switch-on condition of the PNP type triodes, and therefore the first triode and the second triode are both switched on. Voltage of the power source is stably applied to the emitters of the first triode and the second triode by the first inductor, the voltage is stably applied to the laser transmitter driver chip by the second inductor, the voltage is stably applied to the laser transmitter by the third inductor, and the current provided by the power source flows to the bias pin through the first triode, flows to the positive terminal of the laser transmitter through the second triode and flows through the laser transmitter, so that the laser transmitter emits light.

In a practical application, when the ONU where the optical module in this embodiment is positioned is designed, SFF is adopted for packaging the optical module, and BOSA realizes an uplink burst transmission rate being 1.25 Gb/s of 14 channels and realizes a downlink continuous receiving rate being 1.25 Gb/s of 16 channels with PRBS 7, an uplink channel wavelength is C wave band wide spectrum receiving, a downlink channel wavelength is C− wave band, and a channel interval is 100 GHz.

According to the optical module provided by this embodiment, based on the previous embodiment, the emitters of the first triode and the second triode are connected by the first inductor, the first collector and the first and second bases are connected with the bias pin by the second inductor, and the second collector is connected with the positive terminal of the laser transmitter by the third inductor; a circuit where the laser transmitter driver chip and the laser transmitter are positioned is prevented from being damaged due to overlarge voltage at the moment of being switched on, the first triode and the second triode are controlled to be switched on or switched off at the same time by setting the level of the bias pin to be high-level or low-level, thus controlling the laser transmitter to emit light or not. In a case that the laser transmitter and the laser transmitter driver chip are both in the SINK mode, whether current flows to the bias pin and the positive terminal of the laser transmitter can be controlled simultaneously by the power source and the two PNP type triodes, thereby controlling the laser transmitter to emit light by the laser transmitter driver chip in the SINK mode.

Figure 4:
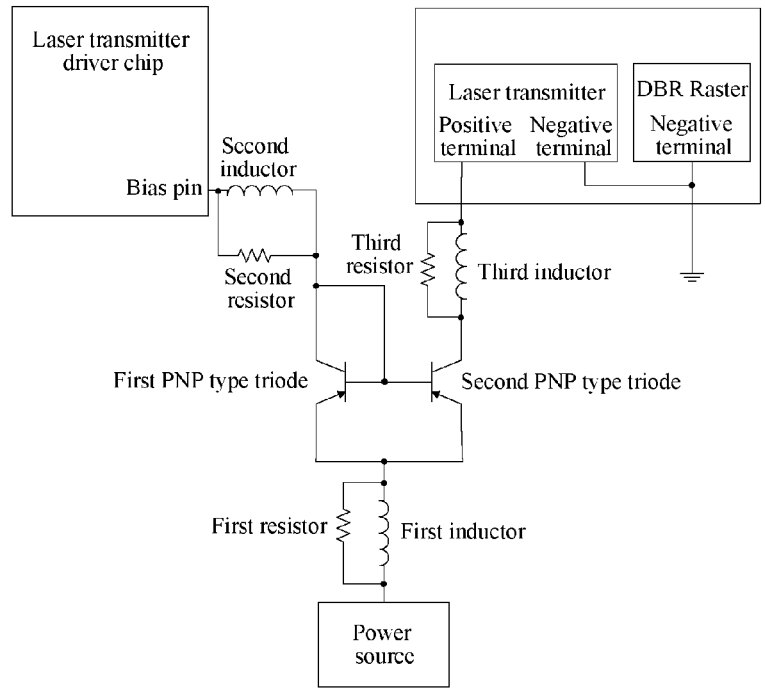
FIG. 4 is a schematic diagram of an optical module according to some embodiments of the disclosure.

FIG. 4 is a schematic diagram of an optical module according to some embodiments of the disclosure. As shown in FIG. 4, based on the previous embodiment, in order to optimize an eye pattern and the transmission performance of the optical module, in the optical module provided by this embodiment, the emitters of the first triode and the second triode are connected with the power source by a first resistor; and/or the first collector and the first and second bases are connected with the bias pin of the laser transmitter driver chip by a second resistor; and/or the second collector is connected with the positive terminal of the laser transmitter by a third resistor.

The eye pattern refers to a waveform displayed on an oscilloscope during experiment. In this embodiment, the first resistor, the second resistor and the third resistor are arranged to further isolate a low-frequency noise signal and enable the transmission performance of the optical module to be more optimized.

In a practical application, as shown in FIG. 4, in the optical module, the first inductor, the second inductor, the third inductor, the first resistor, the second resistor and the third resistor are arranged between the emitters of the first triode and the second triode and the power source, between the first collector and the first and second bases and the bias pin of the laser transmitter driver chip, and between the second collector and the positive terminal of the laser transmitter, and the first resistor, the second resistor and the third resistor are connected between the two ends of the first inductor, the second inductor and the third inductor in parallel respectively.

It should be noted that the first inductor and the first resistor connected in parallel are arranged between the emitters of the first triode and the second triode and the power source; and/or the second inductor and the second resistor connected in parallel are arranged between the first collector and the first and second bases and the bias pin of the laser transmitter driver chip; and/or the third inductor and the third resistor connected in parallel are arranged between the second collector and the positive terminal of the laser transmitter, which is not limited in this embodiment.

In this embodiment, a process of controlling the laser transmitter to emit light by the laser transmitter driver chip in the SINK mode may be obtained with reference to the descriptions in FIG. 2 and FIG. 3, and is not repeated herein.

According to the technical solution provided by this embodiment, the emitters of the first triode and the second triode are connected with the power source by the first resistor; and/or the first and second bases are connected with the bias pin of the laser transmitter driver chip by the second resistor; and/or the second collector is connected with the positive terminal of the laser transmitter by the third resistor, a low-frequency noise signal is further filtered out, and in a case that the laser transmitter and the laser transmitter driver chip are both in the SINK mode, whether current flows to the bias pin and the positive terminal of the laser transmitter can be controlled simultaneously by the power source and the two PNP type triodes, thereby controlling the laser transmitter to emit light by the laser transmitter driver chip in the SINK mode.

Figure 5:
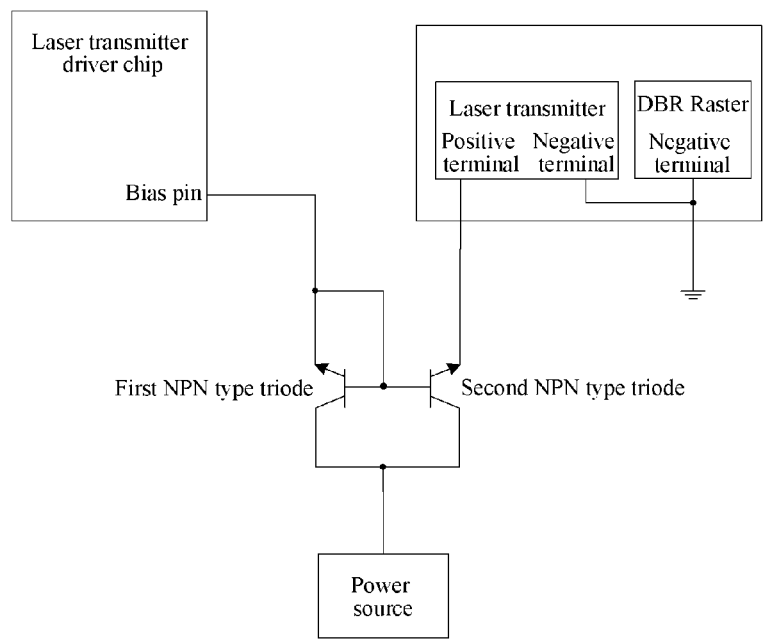
FIG. 5 is a schematic diagram of an optical module according to some embodiments of the disclosure.

FIG. 5 is a schematic diagram of an optical module according to some embodiments of the disclosure. As shown in FIG. 5, the optical module provided by this embodiment may include: a laser transmitter driver chip, a laser transmitter, a DBR raster, a first NPN type triode, a second NPN type triode and a power source. The first NPN type triode ("the third triode") include an emitter ("the third emitter"), a collector ("the third collector") and a base ("the third base"). The second NPN type triode ("the fourth triode") include an emitter ("the fourth emitter"), a collector ("the fourth collector") and a base ("the fourth base"). The laser transmitter includes a positive terminal and a negative terminal. The DBR raster includes a negative terminal.

A third collector and a fourth collector are both connected with the power source. The third emitter, the third base and the fourth base are connected with the bias pin. The fourth emitter is connected with the positive terminal of the laser transmitter, and the negative terminal of the laser transmitter and the negative terminal of the DBR raster are grounded;

A control circuit is used for controlling the level of the bias pin of the laser transmitter driver chip; when the bias pin is low-level, the third triode and the fourth triode are switched on, and the laser transmitter is switched on to emit light; when the bias pin is high-level, the third triode and the fourth triode are switched off, and the laser transmitter is disconnected and does not emit light.

It should be noted that FIG. 4 differs from FIG. 2 in that this embodiment takes an NPN triode as an example for description.

In the prior art, when the DBR laser is designed, the negative terminal of the laser transmitter and the negative terminal of the DBR raster are connected together and grounded, which is caused by two reasons: 1. the negative terminal of the laser transmitter and the negative terminal of the DBR raster are connected together due to a manufacturing process; 2. after grounding, the low level of the DBR raster is stable, which can ensure a stable current flowing by the DBR raster, and therefore, light of different wavelengths can be accurately selected as required by controlling the magnitude change of input current, and such design causes that the laser transmitter can emit light only when the current is input from the positive terminal of the laser transmitter.

For the laser transmitter driver chip in the SINK mode, the bias pin needs an input current, and therefore in this embodiment, the third triode and the fourth triode are arranged between the bias pin of the laser transmitter driver chip and the positive terminal of the laser transmitter, the emitters of the third triode and the fourth triode are connected with the power source to input the current to the bias pin and the positive terminal of the laser transmitter; therefore, the fact that the laser transmitter is controlled to emit light by the laser transmitter driver chip in the SINK mode becomes possible.

In a work process of the optical module, the level of the bias pin in the laser transmitter driver chip is controlled by a control unit in the ONU where the optical module is positioned, and a work principle of the control unit may be obtained with reference to the prior art and is not repeated in this embodiment.

Since the collectors of the third triode and the fourth triode are connected with the power source, the collectors are always high-level, when the bias pin is controlled by the control unit to be high-level, the third emitter and the bases of the third triode and the fourth triode are connected with the bias pin, and therefore the third emitter and the bases of the third triode and the fourth triode are high-level; in other words, the third emitter and the bases and collectors of the third triode and the fourth triode are all high-level, which does not meet a switch-on condition of the NPN type triodes, the third triode and the fourth triode are both switched off, a current loop is disconnected, that is, the current provided by the power source cannot flow to the bias pin and the positive terminal of the laser transmitter, and in this case, since no current flows by the laser transmitter, the laser transmitter does not emit light.

When the bias pin is controlled by the control unit to be low-level, the third emitter and the bases of the third triode and the fourth triode are connected with the bias pin, and therefore the third emitter and the bases of the third triode and the fourth triode are low-level; in other words, the third emitter and the bases of the third triode and the fourth triode are low-level, and collectors of the third triode and the fourth triode are both high-level, the collectors are higher than the bases in level, which meets a switch-on condition of the NPN type triodes, the third triode and the fourth triode are both switched on, the current provided by the power source flows to the bias pin through the third triode and flows to the positive terminal of the laser transmitter through the fourth triode, the current flowing to the positive terminal of the laser transmitter flows out from the negative terminal of the laser transmitter, and the laser transmitter emits light.

In other words, in this embodiment, the level of the bias pin is set to be high-level or low-level, the third triode and the fourth triode are switched on or switched off at the same time, thereby controlling the laser transmitter to emit light or not.

In a practical application, when the optical network unit where the optical module in this embodiment is positioned is designed, SFF is adopted for packaging, and BOSA realizes an uplink burst transmission rate being 1.25 Gb/s of 14 channels and realizes a downlink continuous receiving rate being 1.25 Gb/s of 16 channels with PRBS 7, an uplink channel wavelength is C wave band wide spectrum receiving, a downlink channel wavelength is C− wave band, and a channel interval is 100 GHz.

According to the optical module provided by this embodiment, the collectors of the third triode and the fourth triode are connected with the power source, the collectors are high-level always, when the bias pin of the laser transmitter driver chip is set to be high-level, the bases of the third triode and the fourth triode connected with the bias pin and the third emitter are high-level, in this case, the third triode and the fourth triode are both switched off, no current flows from the power source to the bias pin and the positive terminal of the laser transmitter, and the laser transmitter does not emit light. When the bias pin of the laser transmitter driver chip is set to be low-level, the third emitter and the connected bases of the third triode and the fourth triode are low-level, the third triode and the fourth triode are both switched on, current flows from the power source to the bias pin through the third triode and flows to the positive terminal of the laser transmitter through the fourth triode, and the laser transmitter emits light. In a case that the laser transmitter and the laser transmitter driver chip are both in the SINK mode, whether current flows to the bias pin and the positive terminal of the laser transmitter can be controlled simultaneously by the power source and the two NPN type triodes, thereby controlling the laser transmitter to emit light by the laser transmitter driver chip in the SINK mode.

Figure 6:
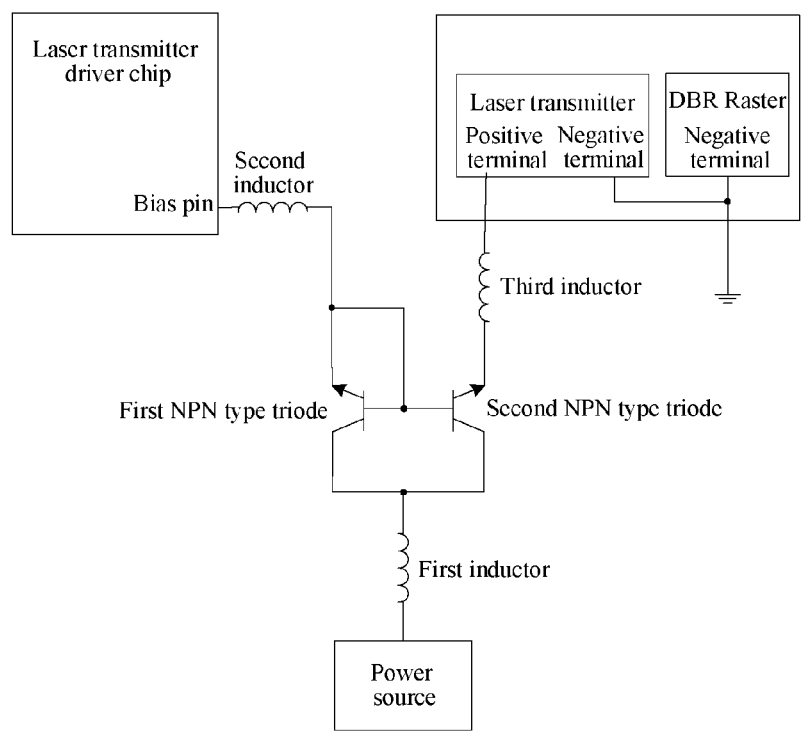
FIG. 6 is a schematic diagram of an optical module according to some embodiments of the disclosure.

FIG. 6 is a schematic diagram of an optical module according to some embodiments of the disclosure. As shown in FIG. 6, based on the previous embodiment, in order to filter a noise signal, in the optical module of this embodiment, the collectors of the third triode and the fourth triode are connected with the power source by a first inductor; and/or the third emitter and the bases of the third triode and the fourth triode are connected with the bias pin of the laser transmitter driver chip by a second inductor; and/or the fourth emitter is connected with the positive terminal of the laser transmitter by a third inductor.

It should be understood that due to the low frequency-on and high frequency-off characteristic of the inductor, the inductor can serve as a filter device, in this embodiment, the collectors of the third triode and the fourth triode are connected with the power source by the first inductor; therefore, the voltage of the power source can be stably applied to the third triode and the fourth triode, and the third triode and the fourth triode are prevented from being damaged due to overlarge voltage at the moment of being switched on.

The third emitter and the bases of the third triode and the fourth triode are connected with the bias pin of the laser transmitter driver chip by the second inductor; therefore, the voltage can be stably applied to the laser transmitter driver chip by the second inductor, and the laser transmitter driver chip is prevented from being damaged due to overlarge voltage at the moment of being switched on.

The fourth emitter is connected with the positive terminal of the laser transmitter by the third inductor; therefore, the voltage can be stably applied to the laser transmitter by the third inductor, and the laser transmitter is prevented from being damaged due to overlarge voltage at the moment of being switched on.

It should be noted that the first inductor, the second inductor and the third inductor can be connected in the circuit at the same time, or at least one of the first inductor, the second inductor and the third inductor is connected, which is not limited by this embodiment.

In this embodiment, since the collectors of the third triode and the fourth triode are connected with the power source by the first inductor, the collectors are always high-level, when the bias pin is controlled by the control unit to be high-level, the third emitter and the bases of the third triode and the fourth triode are connected with the bias pin by the second inductor, and therefore the third emitter and the bases of the third triode and the fourth triode are high-level; in other words, the third emitter and the bases and collectors of the third triode and the fourth triode are all high-level, which does not meet a switch-on condition of the NPN type triodes, the third triode and the fourth triode are both switched off, a current loop is disconnected, that is, the current provided by the power source cannot flow to the bias pin and the positive terminal of the laser transmitter, and in this case, since no current flows by the laser transmitter, the laser transmitter does not emit light.

When the bias pin is controlled by the control unit to be low-level, the third emitter and the bases of the third triode and the fourth triode are connected with the bias pin by the second inductor, and therefore the third emitter and the bases of the third triode and the fourth triode are low-level; in other words, the bases of the third triode and the fourth triode are low-level, and the collectors of the third triode and the fourth triode are both high-level, the collectors are higher than the bases in level, which meets a switch-on condition of the NPN type triodes, the third triode and the fourth triode are both switched on, voltage of the power source is stably applied to the collectors of the third triode and the fourth triode by the first inductor, the voltage is then stably applied to the laser transmitter driver chip by the second inductor, the voltage is stably applied to the laser transmitter by the third inductor, and the current provided by the power source flows to the bias pin through the third triode, flows to the positive terminal of the laser transmitter through the fourth triode and flows through the laser transmitter, so that the laser transmitter emits light.

In a practical application, when the ONU where the optical module in this embodiment is positioned is designed, SFF is adopted for packaging, and BOSA realizes an uplink burst transmission rate being 1.25 Gb/s of 14 channels and realizes a downlink continuous receiving rate being 1.25 Gb/s of 16 channels with PRBS 7, an uplink channel wavelength is C wave band wide spectrum receiving, a downlink channel wavelength is C-wave band, and a channel interval is 100 GHz.

According to the optical module provided by this embodiment, based on the previous embodiment, the collectors of the third triode and the fourth triode are connected by the first inductor, the third emitter and the bases of the third triode and the fourth triode are connected with the bias pin by the second inductor, and the fourth emitter is connected with the positive terminal of the laser transmitter by the third inductor; a circuit where the laser transmitter driver chip and the laser transmitter are positioned is prevented from being damaged due to overlarge voltage at the moment of being switched on, the third triode and the fourth triode are controlled to be switched on or switched off at the same time by setting the level of the bias pin to be high-level or low-level, thus controlling the laser transmitter to emit light or not. In a case that the laser transmitter and the laser transmitter driver chip are both in the SINK mode, whether current flows to the bias pin and the positive terminal of the laser transmitter can be controlled simultaneously by the power source and the two NPN type triodes, thereby controlling the laser transmitter to emit light by the laser transmitter driver chip in the SINK mode.

Figure 7:
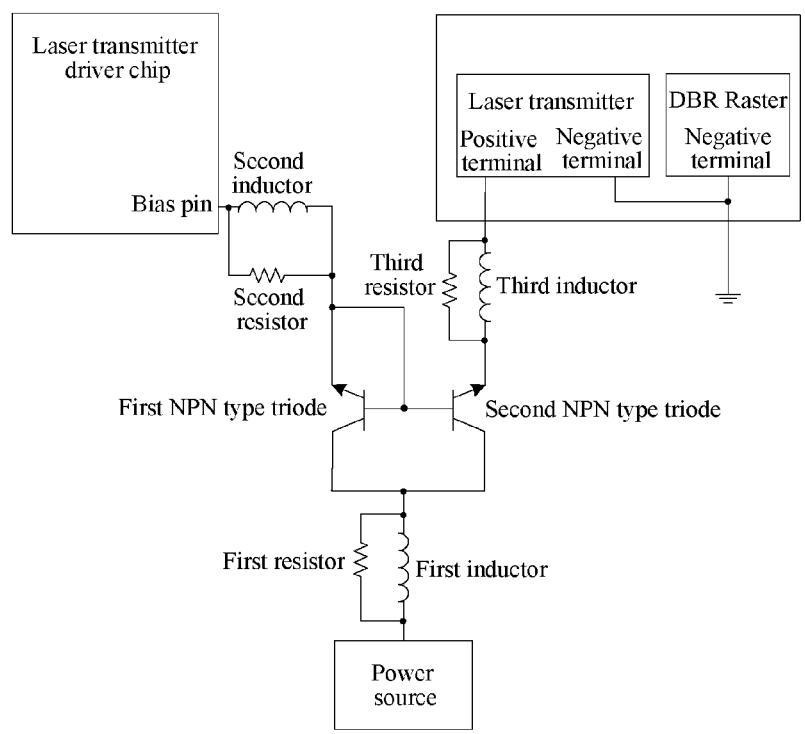
FIG. 7 is a schematic diagram of an optical module according to some embodiments of the disclosure.

FIG. 7 is a schematic diagram of an optical module according to some embodiments of the disclosure. As shown in FIG. 7, based on the previous embodiment, in order to optimize an eye pattern and the transmission performance of the optical module, in the optical module provided by this embodiment, the collectors of the third triode and the fourth triode are connected with the power source by a first resistor; and/or the third emitter and the bases of the third triode and the fourth triode are connected with the bias pin of the laser transmitter driver chip by a second resistor; and/or the fourth emitter is connected with the positive terminal of the laser transmitter by a third resistor.

The eye pattern is a waveform displayed on an oscilloscope during experiment. In this embodiment, the first resistor, the second resistor and the third resistor are arranged to further isolate a low-frequency noise signal and enable the transmission performance of the optical module to be more optimized.

In a practical application, as shown in FIG. 7, in the optical module, the first inductor, the second inductor, the third inductor, the first resistor, the second resistor and the third resistor are arranged between the collectors of the third triode and the fourth triode and the power source, between the third emitter and the bases of the third triode and the fourth triode and the bias pin of the laser transmitter driver chip, and between the fourth emitter and the positive terminal of the laser transmitter, and the first resistor, the second resistor and the third resistor are connected between the two ends of the first inductor, the second inductor and the third inductor in parallel respectively, so as to connect the first resistor, the second resistor and the third resistor in parallel, further isolate a low-frequency noise signal, and enable the transmission performance of the optical module to be more optimized.

It should be explained that the first inductor and the first resistor connected in parallel are arranged between the collectors of the third triode and the fourth triode and the power source; and/or the second inductor and the second resistor connected in parallel are arranged between the third collector and the bases of the third triode and the fourth triode and the bias pin of the laser transmitter driver chip; and/or the third inductor and the third resistor connected in parallel are arranged between the fourth emitter and the positive terminal of the laser transmitter, which is not limited in this embodiment.

In this embodiment, a process of controlling the laser transmitter to emit light by the laser transmitter driver chip in the SINK mode may be obtained with reference to the descriptions in FIG. 5 and FIG. 6, and is not repeated herein.

According to the technical solution provided by this embodiment, the emitters of the third triode and the fourth triode are connected with the power source by the first resistor; and/or the bases of the third triode and the fourth triode are connected with the bias pin of the laser transmitter driver chip by the second resistor; and/or the fourth collector is connected with the positive terminal of the laser transmitter by the third resistor, a low-frequency noise signal is further filtered. In a case that the laser transmitter and the laser transmitter driver chip are both in the SINK mode, whether current flows to the bias pin and the positive terminal of the laser transmitter can be controlled simultaneously by the power source and the two NPN type triodes, thereby controlling the laser transmitter to emit light by the laser transmitter driver chip in the SINK mode.

Finally, it should be noted that above respective embodiments merely intend to describe rather than limit the technical solutions of the present disclosure; although the disclosure is described in detail in reference to the respective embodiments, those of ordinary skill in the art should understand that the technical solutions cited in the respective embodiments can still be modified, or part or all of the technical characteristics therein can be equivalently substituted; and those modifications or replacements do not depart the essence of corresponding technical solutions from the scope of the technical solutions of respective embodiments of the disclosure.

The invention claimed is:

1. An optical module, comprising:
   a laser transmitter driver chip including a bias pin;
   a laser transmitter including a positive terminal and a negative terminal;
   a Distributed Bragg Reflector (DBR) raster including a negative terminal;
   a first triode including a first emitter, a first collector, and a first base;
   a second triode including a second emitter, a second collector and a second base; and
   a power source, wherein
   the first emitter and second emitter are both connected to the power source,
   the first collector, the first base and the second base are connected to the bias pin,
   the second collector is connected to the positive terminal of the laser transmitter,
   the negative terminal of the laser transmitter and the negative terminal of the DBR raster are grounded.

2. The optical module according to claim 1, wherein the first triode is a PNP type triode; and
   the second triode is a PNP type triode.

3. The optical module according to claim 1, wherein when the bias pin is low-level, the first triode and the second triode are switched on, and the laser transmitter is switched on to emit light.

4. The optical module according to claim 1, wherein when the bias pin is high-level, the first triode and the second triode are switched off, and the laser transmitter is switched off and does not emit light.

5. The optical module according to claim 1, further comprising a first inducer including:
   a first side connected to the first emitter and the second emitter; and
   a second side connected to the power source.

6. The optical module according to claim 1, further comprising a second inducer including:
   a first side connected to the first collector, the first base, and the second base; and
   a second side connected to the bias bin.

7. The optical module according to claim 1, further comprising a third inducer including:
   a first side connected to the second collector; and
   a second side connected to the positive terminal of the laser transmitter.

8. The optical module according to claim 1, further comprising a first resister including:
   a first side connected to the first emitter and the second emitter; and
   a second side connected to the power source.

9. The optical module according to claim 1, further comprising a second resister including:
   a first side connected to the first collector, the first base, and the second base; and
   a second side connected to the bias bin.

10. The optical module according to claim 1, further comprising a third resister including:

a first side connected to the second collector; and
a second side connected to the positive terminal of the laser transmitter.

11. An optical module, comprising:
a laser transmitter driver chip including a bias pin;
a laser transmitter including a positive terminal and a negative terminal;
a Distributed Bragg Reflector (DBR) raster including a negative terminal;
a first triode including a first emitter, a first collector, and a first base;
a second triode including a second emitter, a second collector and a second base; and
a power source, wherein
the first collector and the second collector are both connected to the power source,
the first emitter, the first base, and the second base are connected to the bias pin,
the second emitter is connected to the positive terminal of the laser transmitter, and
the negative terminal of the laser transmitter and the negative terminal of the DBR raster are grounded.

12. The optical module of claim 11, wherein the first triode is an NPN type triode; and
the second triode is an PNP type triode.

13. The optical module according to claim 11, wherein when the bias pin is low-level, the first triode and the second triode are switched on, and the laser transmitter is switched on to emit light.

14. The optical module according to claim 11, wherein when the bias pin is high-level, the first triode and the second triode are switched off, and the laser transmitter is switched off and does not emit light.

15. The optical module according to claim 11, further comprising a first inducer including:
a first side connected to the first connector and the second connector; and
a second side connected to the power source.

16. The optical module according to claim 11, further comprising a second inducer including:
a first side connected to the first emitter, the first base, and the second base; and
a second side connected to the bias bin.

17. The optical module according to claim 11, further comprising a third inducer including:
a first side connected to the second emitter; and
a second side connected to the positive terminal of the laser transmitter.

18. The optical module according to claim 11, further comprising a first resister including:
a first side connected to the first connector and the second connector; and
a second side connected to the power source.

19. The optical module according to claim 11, further comprising a second resister including:
a first side connected to the first emitter, the first base, and the second base; and
a second side connected to the bias bin.

20. The optical module according to claim 11, further comprising a third resister including:
a first side connected to the second emitter; and
a second side connected to the positive terminal of the laser transmitter.

* * * * *